(12) United States Patent
Ikagawa

(10) Patent No.: US 8,306,076 B2
(45) Date of Patent: Nov. 6, 2012

(54) DRIVER CIRCUIT FOR TUNABLE LD

(75) Inventor: Tomoko Ikagawa, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 76 days.

(21) Appl. No.: 13/053,954

(22) Filed: Mar. 22, 2011

(65) Prior Publication Data

US 2011/0235660 A1    Sep. 29, 2011

(30) Foreign Application Priority Data

Mar. 23, 2010   (JP) .................. 2010-066741

(51) Int. Cl.
*H01S 3/10* (2006.01)
(52) U.S. Cl. .................. 372/25; 372/29.012; 372/29.02; 372/30; 372/38.07
(58) Field of Classification Search ............... 372/25, 372/29.012, 29.02, 30
See application file for complete search history.

(56) References Cited

U.S. PATENT DOCUMENTS

| | | | |
|---|---|---|---|
| 6,687,267 B2* | 2/2004 | Bukkems | 372/20 |
| 6,690,693 B1* | 2/2004 | Crowder | 372/29.02 |
| 7,778,294 B2 | 8/2010 | Nishimura et al. | |
| 2009/0168817 A1* | 7/2009 | Ishikawa et al. | 372/20 |

* cited by examiner

*Primary Examiner* — Dung Nguyen
(74) *Attorney, Agent, or Firm* — Venable LLP; Michael A. Sartori

(57) ABSTRACT

An LD driver is disclosed where the power dissipation is reduced without enlarging the circuit scale. The LD driver, which drives a tunable LD including a SG-DGB region, a CSG-DBR region, and an SOA region, includes a DC/DC converter connected to current sources or voltage sources each coupled with at least two regions of the SG-DFB, CSG-DBR and SOA regions, and a voltage controller to control the output of the DC/DC converter which is commonly provided to the current sources or the voltage sources. The voltage controller independently monitors the bias conditions of the at least two regions above, and sets the output of the DC/DC converter so as to exceed a largest voltage among voltages currently provided to respective regions by a preset margin to operate the current sources or the voltage sources normally.

9 Claims, 7 Drawing Sheets

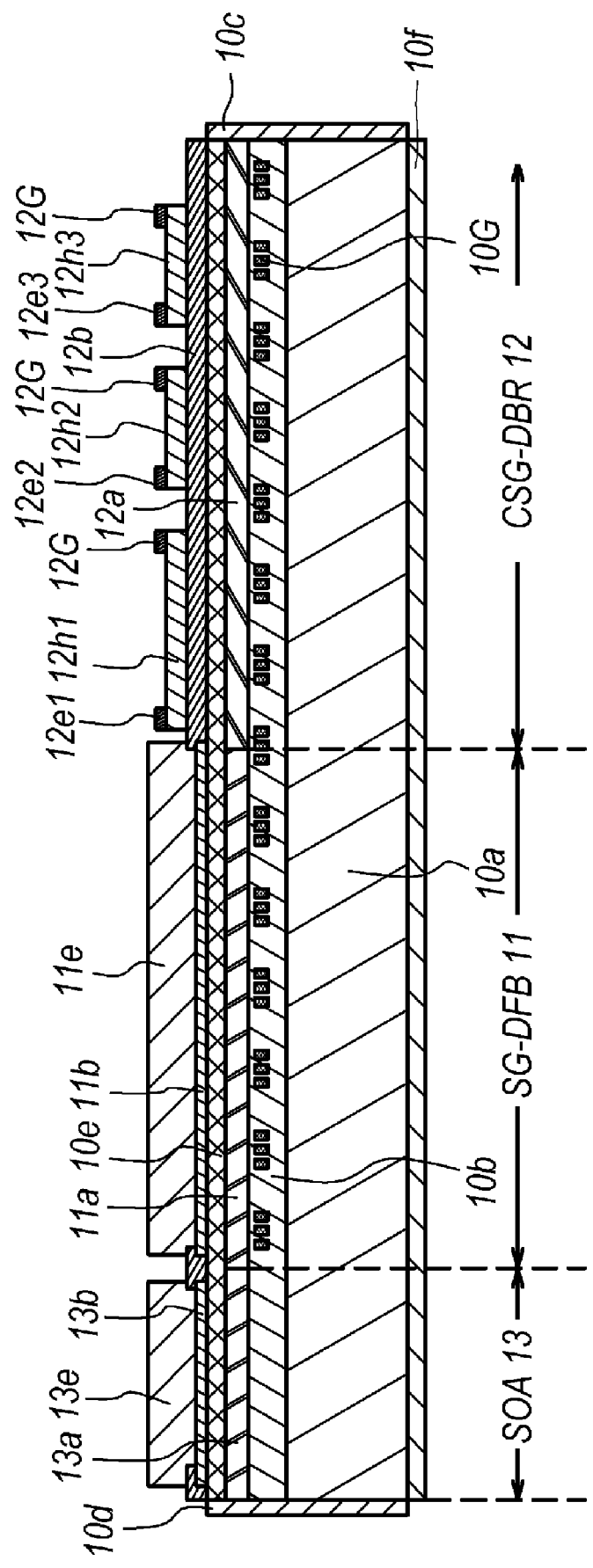

DRIVER CIRCUIT FOR TUNABLE LD

BACKGROUND OF THE INVENTION

1. Field of the Invention

The preset invention relates to a driver circuit for a semiconductor laser diode (hereafter denoted as LD), in particular, the driver circuit of the present invention is for a wavelength tunable LD.

2. Related Prior Arts

A tunable LD includes a region for a semiconductor optical amplifier (hereafter denoted as SOA), a gain region and a wavelength control region as schematically illustrated in FIG. 7. These regions are operated and controlled by adjusting a voltage and/or a current supplied thereto. The currents supplied to respective regions are distinguished from the others. For instance, the gain region is necessary to be provided with a current of around 150 mA, the SOA region is provided with another current of about 200 mA, while, the wavelength control region is necessary to be provided with a current of about 100 mA. Accordingly, separate and distinct current sources are provided for respective regions. Moreover, the wavelength control region sometimes needs a plurality of current sources. The current for the gain region is often fixed to a designed value, while, those for the SOA region and the wavelength control region depend on the wavelength of the output light.

FIG. 5 schematically shows a conventional driver circuit 100 for the tunable LD. The driver circuit 100 drives the tunable LD 101 that provides the gain region 101a, the wavelength control region 101b, and the SOA region 101c. The driver 100 includes three current sources, 102 to 104; that is, a first current source 102 connected to the SOA region 101C, a second current source 103 connected to the gain region 101a, and a third current source 104 connected to the wavelength control region 101b. The SOA region 101c and the gain region 101a, which are simply illustrated by a symbol often used for the diode in FIG. 5, are formed on a common semiconductor substrate. Moreover, any of current sources, 102 to 104, which may be replaced by a voltage source, are connected to the power supply Vcc and controlled in the output current thereof by the voltage controller 105.

However, a conventional driver circuit 100 for a tunable LD such as those shown in FIG. 5 has a power supply Vcc common to respective current sources, 102 to 104, and the common power supply Vcc is necessary to be set in a maximum voltage for all supposed conditions including the optical output power, the aging of the LD, the operating temperature, the sudden change of the output wavelength, and so on. Accordingly, the power consumption of the driver circuit inevitably becomes large. Recent optical transceiver is going to be implemented with a tunable LD in a small sized package such as those defined in the XFP standard. Further lower power consumption is indispensable.

A United States patent issued as U.S. Pat. No. 7,778,294 has disclosed an apparatus that installs a laser driver for driving an LD to write information on an optical disk. FIG. 6 is a block diagram of the laser driver disclosed therein. The optical disk apparatus includes an LD 201, a laser driver 202 to driver the LD 201. The apparatus further provides a detector 204 to detect a bias voltage applied to the LD 201, a DC/DC converter 203 to vary the power supplied to the driver 202, and a CPU to control the DC/DC converter 203.

However, applying the LD driver shown in FIG. 6 to the tunable LD 101 shown in FIG. 5, respective regions, that is the wavelength control region 101b and the SOA region 101 are necessary to be implemented with an individual power supply circuit shown in FIG. 6, which inevitably makes the driver circuit larger. The present invention provides one solution for a subject above described.

SUMMARY OF THE INVENTION

A driver circuit for the tunable LD that includes a gain region (SG-DFB region) for generating light provided with a first current, a wavelength selective region (CSG-DBR region) provided with a second current, and a amplifying region (SOA region) provided with a third current, has features that it comprises a DC/DC converter whose output is commonly provided to at least two of current sources among current sources for providing said first to third currents to respective regions, and a voltage controller to control the output of the DC/DC converter such that, by monitoring bias levels of the SG-DFB region, the CSG-DBR region, and the SOA region individually, the output of the DC/DC converter becomes equal to a value greater than a highest bias voltage among bias voltages currently applied to respective regions by a preset margin that is necessary to operate the current source normally.

The driver circuit of the present invention may provide one DC/DC converter whose output is commonly provided to at least two current sources each providing currents to two of the SG-DGB region, the CSG-DBR region and the SOA region; and the output of the DC/DC converter may be adjusted in a minimum voltage necessary to operate the specific current source, which is a value greater than a highest value currently provided to respective regions by a preset margin which is necessary to operate the current source normally.

BRIEF DESCRIPTION OF DRAWINGS

The foregoing and other purposes, aspects and advantages will be better understood from the following detailed description of a preferred embodiment of the invention with reference to the drawings, in which:

FIG. 7 schematically illustrates a cross section of the tunable LD along the longitudinal direction, which is driven by the driver circuit of the present invention.

DETAILED DESCRIPTION OF PREFERRED EMBODIMENTS

Next, some preferred embodiments according to the present invention will be described as referring to accompanying drawings. In the description of the drawings, the same or like elements will be referred by the same or like numerals of symbols without over lapping explanations.

First Embodiment

Figure 1:
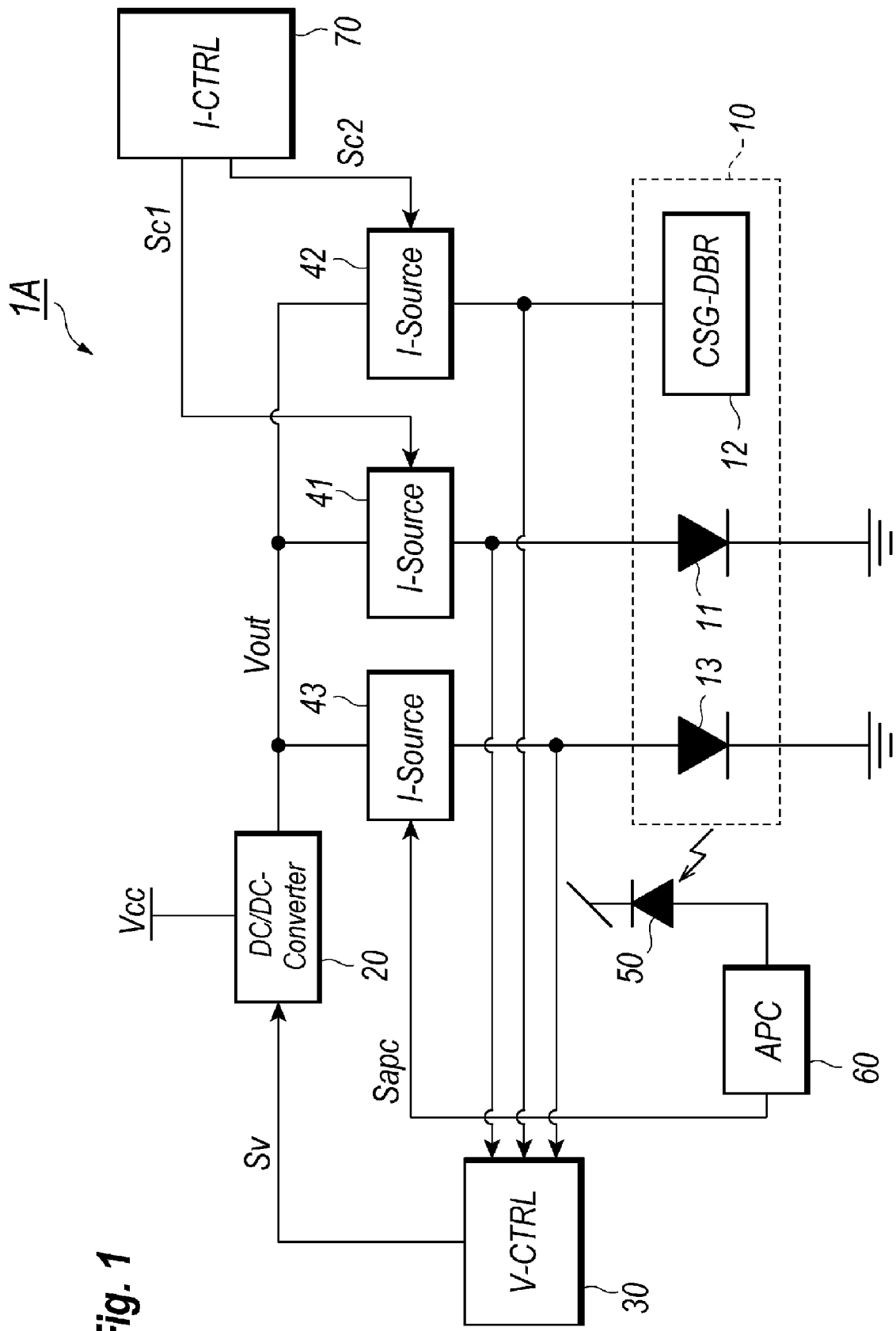
FIG. 1 is a block diagram of a driver circuit for a wavelength tunable LD according to a first embodiment of the present invention.

FIG. 1 is a block diagram of a driver circuit for a tunable LD 10, and FIG. 7 schematically shows a cross section of the tunable LD 10. Referring to FIG. 7, the tunable LD 10 includes a CSG-DBR (Chirped-Sampled-Grating Distributed Bragg Reflector) region 12, an SG-DFB (Sampled-Grating Distributed Feed-Back) region 11, and an SOA (Semiconductor Optical Amplifier) region 13, where these regions are coupled in series and may be integrated on a common semiconductor substrate.

The SG-DFB region 11, which operates as an optically gain region, stacks a lower cladding layer 10b, an active layer 11a, an upper cladding layer 10e, a contact layer 11b and an electrode 11e. The CSG-DBR region 12, which operates as a wavelength selective regions, includes the lower cladding layer 10b, a waveguide layer 12a, the upper cladding layer 10e, an insulating film 12b, and a plurality of heaters, 12h1 to 12h3, on the common substrate 10a. Each of heaters, 12h1 to 12h3, provides an electrode, 12e1 to 12e3, and a ground 12G. The SOA region 13 continues to the SG-DFB region 11, and includes the lower cladding layer 10b, an amplifying layer 13a, the upper cladding layer 10e, a contact layer 13b and an electrode 13e, also on the common substrate 10a. The present embodiment shown in FIG. 7 provides the insulating film between the electrode 11e in the DG-DFB region 11 and the electrode 13e of the SOA region 13. The tunable LD 10 provides the semiconductor substrate 10a, the lower cladding layer 10b, and the upper cladding layer 10e are common in the SG-DFB region 11, the CSG-DBR region 12 and the SOA region 13; and the active layer 11a, the waveguide layer 12a, and the amplifying layer 13a have a common bottom level, that is, these three layers, 11a, 12a, and 13a, are formed on the lower cladding layer 10b with a substantially flat upper level thereof.

A facet in the SOA region 13 provides an anti-reflective (AR) film 10d on the facet of the substrate 10a, the lower cladding layer 10b, the amplifying layer 13a, and the upper lading layer 10e, which constitutes a light emitting surface, in other words, the front facet of the tunable LD 10; while, another face in the CSG-DBR region 12 provides a reflective film 10c on the face of the substrate 10a, the lower cladding layer 10b, the waveguide layer 12a, and the upper cladding layer 10e, which constitutes a light reflecting surface, the rear facet, of the tunable LD 10. The ground 12G of the heaters, 12h1 to 12h3, are connected to the electrode 10f in the back surface of the substrate 10a in an outside of the tunable LD 10.

A plurality of gratings 10G is formed in the lower cladding layer 10b of SG-DFB region 11 and the CSG-DBR region 12. The grating 10G is made of material with a refractive index different from that of the lower cladding layer 10b. Each of gratings 10G coupled with a neighbor space without any gratings 10G constitutes one segment. The CSG-DBR region provides at least two types of segments each having an optical length different from the other. The peak reflectivity of the CSG-DBR region 12, that is, the reflectivity itself and a wavelength showing the peak reflectivity, strongly depends on the optical length of respective segments. While, segments in the SG-DFB region 12 each has an optical length substantially equal to the others.

The active layer 11a of the SG-DFB region 12 may be made of material showing the optical gain at a target wavelength; while, the waveguide layer 12a of the CSG-DBR region 12 may be made of material with a bandgap wavelength shorter than the oscillation wavelength of the tunable LD 10, that is, the waveguide layer 12a of the CSG-DBR region 12 is substantially transparent for the light generated in the SG-DFB region 11. The SG-DFB region 11 provides the electrode 11e to inject carriers into the active layer 11a therein. The electrode 11e of the SG-DFB region 11 corresponds to the first electrode in the description below. The active layer 11a may generate light by being injected with carriers from the electrode 11e.

One of electrodes, 12e1 to 12e3, of the CSG-DBR region 12 may be the second electrode. The SG-DFB region 12 may tune the wavelength of the LD 10 by a current provided from the heater electrodes, 12e1 to 12e3, to the ground 12G. Thus, the tunable LD 10 of the present embodiment may tune the wavelength of the light emitted therefrom according to, what is called, the vernier mechanism between the SG-DFB region 11 and the CSG-DBR region 12 by the current injected thereto. The SOA region 13 may show gain in the amplifying layer 13a by injecting a current from the electrode 13e. This electrode 13e may be the third electrode.

The driver 1A of the present embodiment may further provide a DC/DC-converter 20, a voltage controller 30, current sources, 41 to 43, a monitor photodiode (hereafter denoted as mPD) 50, a APC (Auto-Power-control) circuit 60, and a current controller 70.

The DC/DC-converter 20 provides power to the SG-DFB region 11, the CSG-DBR region 12, and the SOA region 13. That is, the DC/DC-converter 20 may couple with at least to regions of above three regions, 11 to 13, through current sources or voltage sources. The present driver shown in FIG. 1 couples the DC/DC-converter 20 with all three regions, 11 to 13, of the tunable LD 10 though current sources, 41 to 43. The output Vout of the DC/DC-converter 20 may be controlled by an input Sv thereof provided from the voltage controller 30.

The current source 41 may adjust a current supplied to the SG-DFB region 11 depending on a control signal Sc1 provided form the current controller 70. The current source 42 may adjust a current provided to the CSG-DBR region 12 depending on a control signal Sc2 provided from the current controller 70. The third current source 43 may provide a current supplied to the SOA region 13 based on a signal Sapc coming from the APC circuit 60.

Figure 2A:
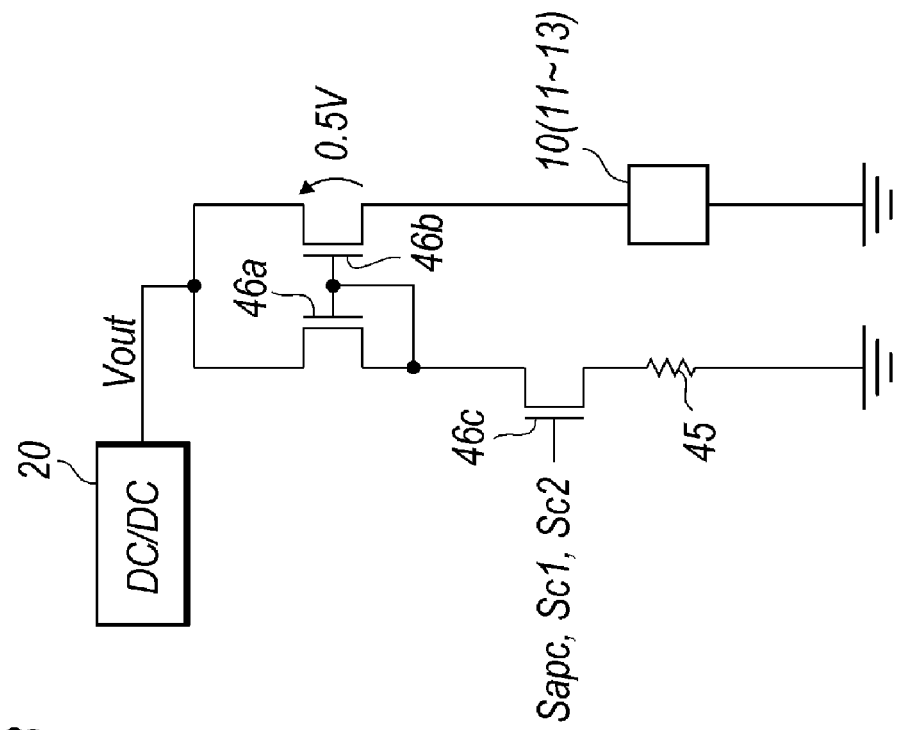
FIG. 2A is a circuit diagram for the current source implemented with the driver circuit of the present invention.
Figure 2B:
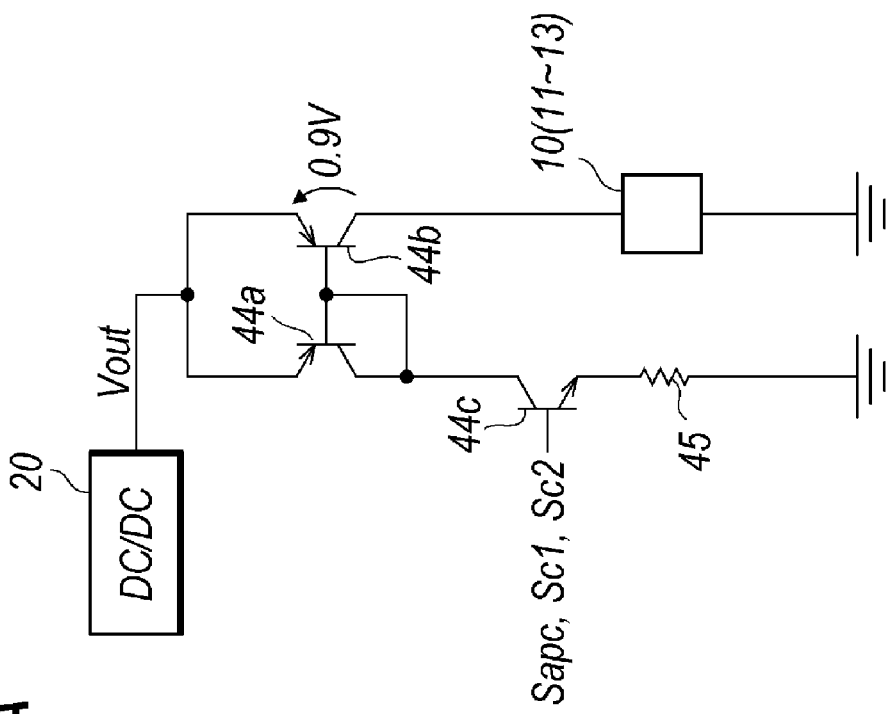
FIG. 2B is another circuit diagram for the current source of the present invention.

FIGS. 2A and 2B show configurations of the current source, 41 to 43. The current source circuit shown in FIG. 2A includes two pnp-transistors, 44a and 44b, and an npn-transistor 44c. Two pnp-transistors, 44a and 44b, constitute a current mirror circuit, where respective bases as a control electrode and respective emitters as one of current electrodes are commonly connected, respectively; while, one of the transistor 44a short-circuits the base with the collector thereof. Thus, the first transistor 44a operates as a source transistor, while, the second transistor 44b operates as a mirror transistor. The common emitter of the current mirror circuit receives the output Vout of the DC/DC-converter 20.

One of paths of the current mirror circuit, that is, the short-circuited collector and the base, is connected with the collector of the third transistor 44c. The emitter of the third transistor 44c is grounded through a resistor 45. Another path of the current mirror circuit, that is, the collector of the second transistor 44b, is led to the electrode, 11e, 12e, or 13e, of the tunable LD 10. The base input, Sapc, Sc1, or Sc2, of the third transistor 44c may determine the magnitude of the current provided to the electrode of the tunable LD. Another configuration of the current source, 41 to 43, is shown in FIG. 2B. This circuit in FIG. 2B replaces bipolar transistors, 44a to 44c, in FIG. 2A with FETs, 46a to 46c. The gate input of the third FET 46c, which is the same signals, Sapc, Sc1, or Sc2, with that shown in FIG. 2A, may determine the magnitude of the current provided to the electrode of the tunable LD 10. The output voltage of the current source, 41 to 43, varies depending on the gate input of the third transistor, 43c or 46c.

Referring to FIG. 1 again, the voltage controller 30 may control the output Vout of the DC/DC converter 20. Specifically, the voltage controller 30 may adjust the output Vout of the DC/D-converter so as to exceed the maximum voltage level among the outputs of the current sources, 41 to 43, by a preset margin by monitoring respective output levels. More specifically, one of electrodes, 11e, 12e1 to 12e3, and 13e, is biased in the largest voltage level, which may be determined by the system, depending on various factors such as the optical output level from the tunable LD 10, the selected wavelength, the long term degradation of the SG-DFB region, and so on. The voltage controller 30 sets the output Vout of the DC/DC-converter 20 so as to exceed this largest voltage level, which is currently monitored, by the preset margin. The preset margin corresponds to a voltage necessary to operate the current sources, 41 to 43, normally. Specifically, the margin in the current source shown in FIG. 2A becomes Vce=0.9V between the emitter and the collector of the second transistor 44b, while, which becomes Vds=0.5V between the source and the drain of the second FET 46b in the circuit of FIG. 2B.

The mPD 50 generates a photocurrent depending on the optical output of the tunable LD 10. The photocurrent from the mPD 50 is led to the APC circuit 60, and the APC circuit 60 adjusts the control signal Sapc such that the photocurrent becomes equal to a target magnitude. The current source 43 coupled with the SOA region 13 may adjust the current injected in the SOA region 13, which controls the optical output of the tunable LD 10, which also varies the bias level applied to the SOA region 13.

The driver circuit 1A thus configured may bias the SG-DFB region 11, the CSG-DBR region 12, and the SOA region 13 by a common DC/DC-converter 20, which may make the driver circuit 1A compact comparing to a configuration where each of the current sources provides an independent DC/DC-converter. Moreover, the driver circuit 1A monitors respective output voltage levels of the current sources, and the output Vout of the common DC/DC-convert 20 may be adjusted so as to exceed the one of the outputs of the current sources, 41 to 43, which currently outputs the largest bias level for respective electrodes of the tunable LD 10, by the preset margin necessary to operate the current sources, 41 to 43, normally, which may minimize the output Vout of the DC/DC-converter 20 and the power dissipation of the driver circuit 10.

Figure 5:
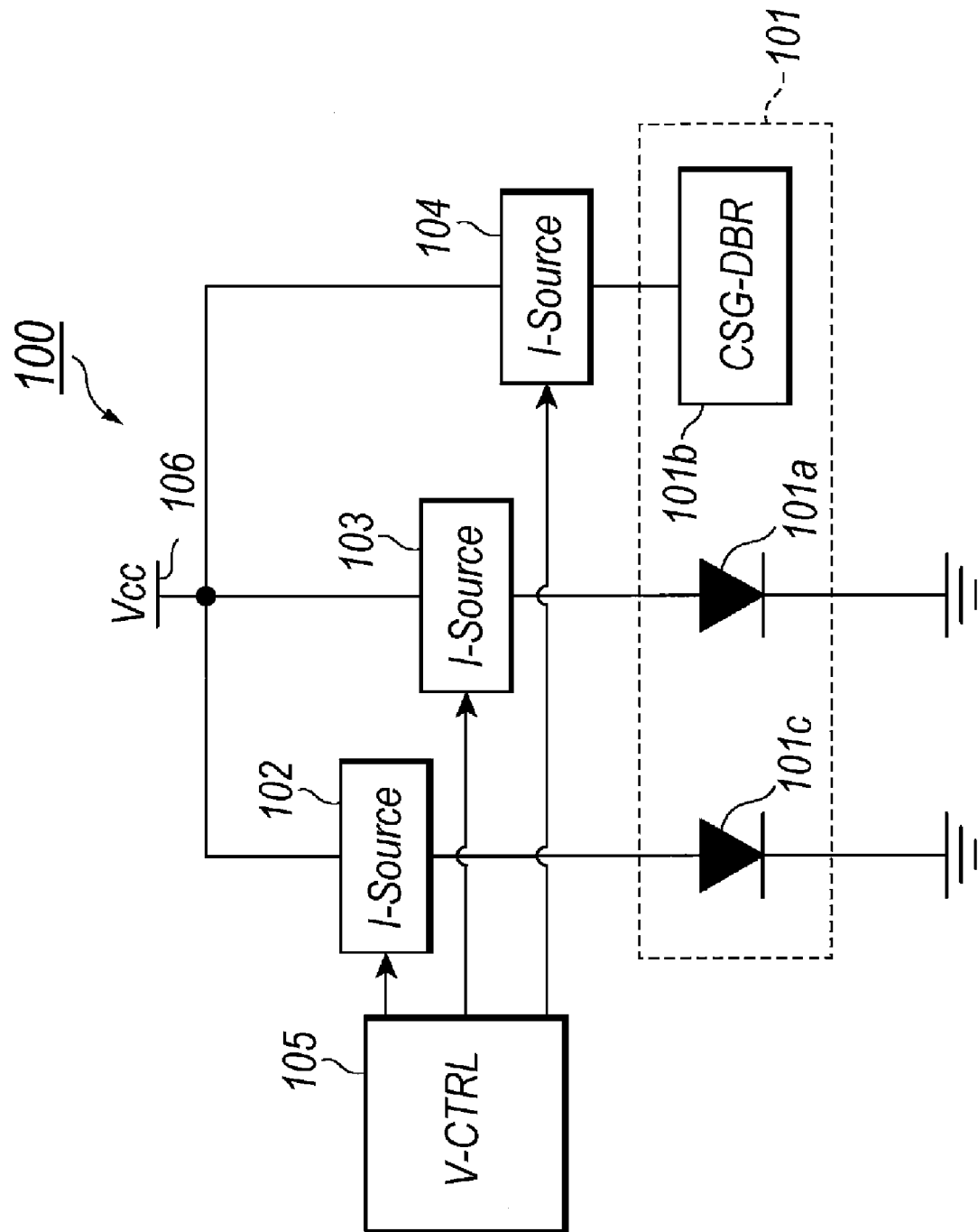
FIG. 5 is a block diagram of a conventional driver circuit for the tunable LD.
Figure 6:
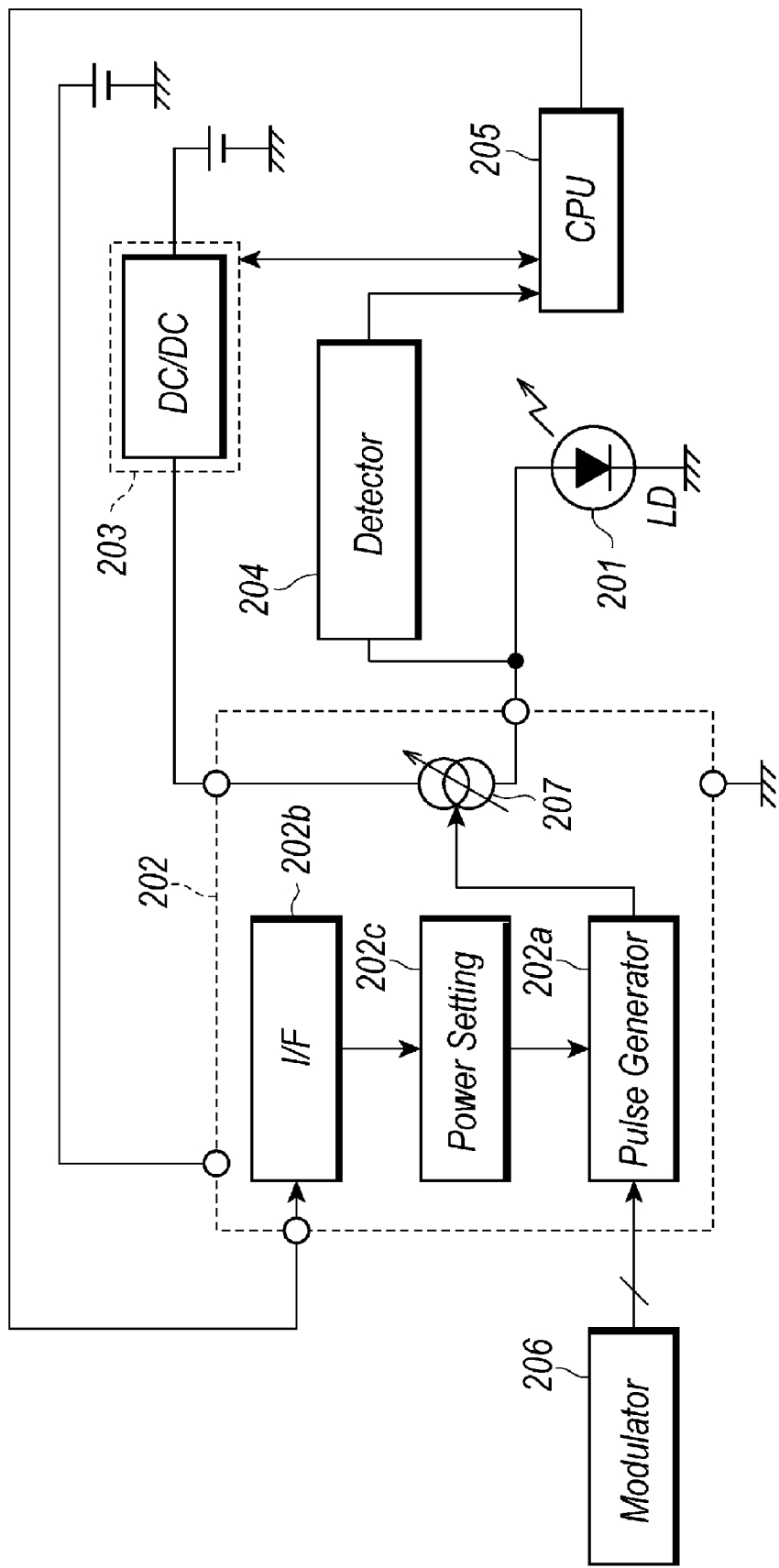
FIG. 6 is a block diagram of the driver circuit and some peripheral circuits disclosed in a prior art.

Assuming a condition where respective electrodes, 11e, 12e1 to 12e3, and 13e, of the tunable LD 10 are necessary to be biased by 1.8V at the maximum and one of the electrodes is currently biased to be 1.5 V, which is the larges among all electrodes; and currents flowing in regions, 11~13, are 200, 100 and 150 mA, respectively; the power supply Vcc in the conventional driver circuit shown in FIG. 5 becomes necessary to output 2.3 V (1.8 [V]+0.5 [V]) and the power consumption thereof becomes 2.3 [V]×0.45[A]=1.035 [W] when the current sources, 102 to 104, has the arrangement same as those shown in FIG. 2B. While, the present driver circuit 1A may only set the output Vout of the DC/DC convert 20 to be equal to 2.0 [V] (1.5V+0.5V) and the power consumption thereof becomes 2.0 [V]×0.45 [A]=0.90 [W] lesser by 0.135 [W] from the conventional driver. Thus, the power consumption of the driver circuit 1A may be reduced by 13%.

Second Embodiment

Figure 3:
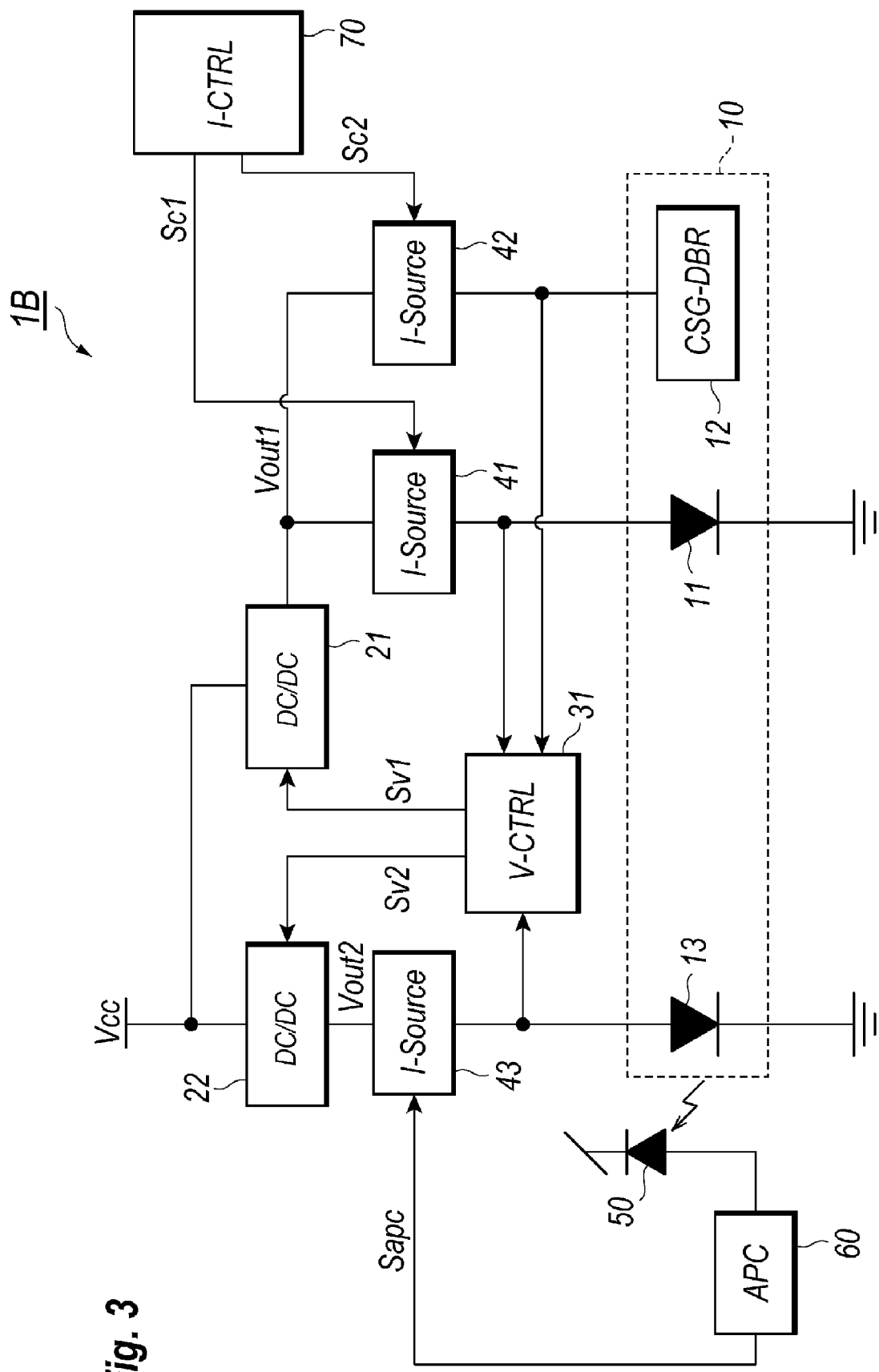
FIG. 3 is a block diagram of a driver circuit for the wavelength tunable LD, which is a circuit according to the second embodiment of the present invention.

FIG. 3 shows a block diagram of a driver circuit 1B according to the second embodiment of the present invention. The driver circuit 1B includes two DC/DC converters, 21 and 22, the voltage controller 31, three current sources, 41 to 43, the mPD 50, the APC circuit 60, and the current controller 70. The arrangement of the tunable LD 10 is same as those shown in FIG. 1.

The first DC/DC-converter 21 provides the power to at least two regions of the tunable LD 10. Specifically, the first DC/Dc converter 21 provides the power to the SG-DFB region 11 and the CSG-DBR region 12 of the tunable LD 10. The second DC/DC-converter 22 provides the power to the SOA region 13. Two DC/DC-converters, 21 and 22, provide an input to which control signals, Sv1 and Sv2, is sent from the voltage controller 31 to adjust the output, Vout1 and Vout2, of the DC/DC-converters, 21 and 22.

The voltage controller 31, as described above, provides two control signals that controls the output voltages, Vout1 and Vout2, of respective DC/DC-converters, 21 and 22. The voltage controller 31 may monitor the biases applied to the SG-DFB region 11 and the CSG-DBR region 12, and control the output Vout of the DC/DC converter 21 so as to exceed the largest bias currently applied by the preset margin to operate the current sources, 41 and 42, normally. The voltage controller 31 concurrently monitors the bias applied to the SOA region 13 independently, and controls output Vout2 provided to the last current source 43 so as to exceed the bias currently applied thereto by the preset margin to operate the current source 43 normally.

The operation of the driver circuit 1B will be described. First, the driver circuit 1B sets the currents provided to the SG-DFB region 11 and the CSG-DBR region 12 in respective initial conditions in which the tunable LD 10 outputs the light with predetermined wavelength. Concurrently, the driver circuit 1B also sets the current supplied to the SOA region 13 such that the tunable LD 10 outputs the light with a preset magnitude as the wavelength thereof is set in the predetermined wavelength above. In these procedures, the outputs, Vout1 and Vout2, of the DC/DC converters are set to be nearly equal to the power supply Vcc, that is, the current sources, 41 to 43, are provided with an enough voltage nearly equal to the power supply Vcc. Then, the voltage controller 31 monitors the biases set in the SG-DFB region 11 and the CSG-DBR region 12 individually, and decreases the output Vout1 of the first DC/DC converter 21 such that the output Vout1 exceeds the higher output among respective outputs of the current sources, 41 and 42, by the preset margin to operate the current sources normally, and also decreases the output Vout2 of the second DC/DC converter 22 so as to exceed the bias currently applied to the SOA region 13 by the preset margin.

In the present driver circuit 1B shown in FIG. 3, two current sources, 41 and 42, are commonly provided with the output Vout1 from the first DC/DC converter 21, which may decrease the number of the DC/DC converters. In particular, although FIGS. 1 and 3 show only one current source 42 for the CSG-DBR region 12, a plurality of current sources is necessary for the CSG-DBR region 12 proportional to the number of heaters implemented therein as shown in FIG. 7 to determine the wavelength of the light output from the tunable LD 10 precisely. In such a case, the arrangement of the driver circuit, 1A or 1B, according to the present embodiments may be effective to simplify the configuration and to decrease the power consumption thereof. In the arrangement of the driver circuit 1B shown in FIG. 3 where the SOA region 13 is supplied the bias current from the particular DC/DC converter 22 independent on the other DC/DC converter 21, the power consumption of the driver circuit 1B may be further reduced because the bias condition for the SOA region 13 often varies widely comparing to the others depending on the APC loop. For instance, the bias condition for the SOA region 13 is sometimes set in a larger current in a lower voltage. In such a case, the independent DC/DC converter 22 only for the SOA region 13 may set the output Vout2 thereof in relatively lower voltage, which may effectively reduce the unnecessary power consumption of the current source 43.

Third Embodiment

Figure 4:
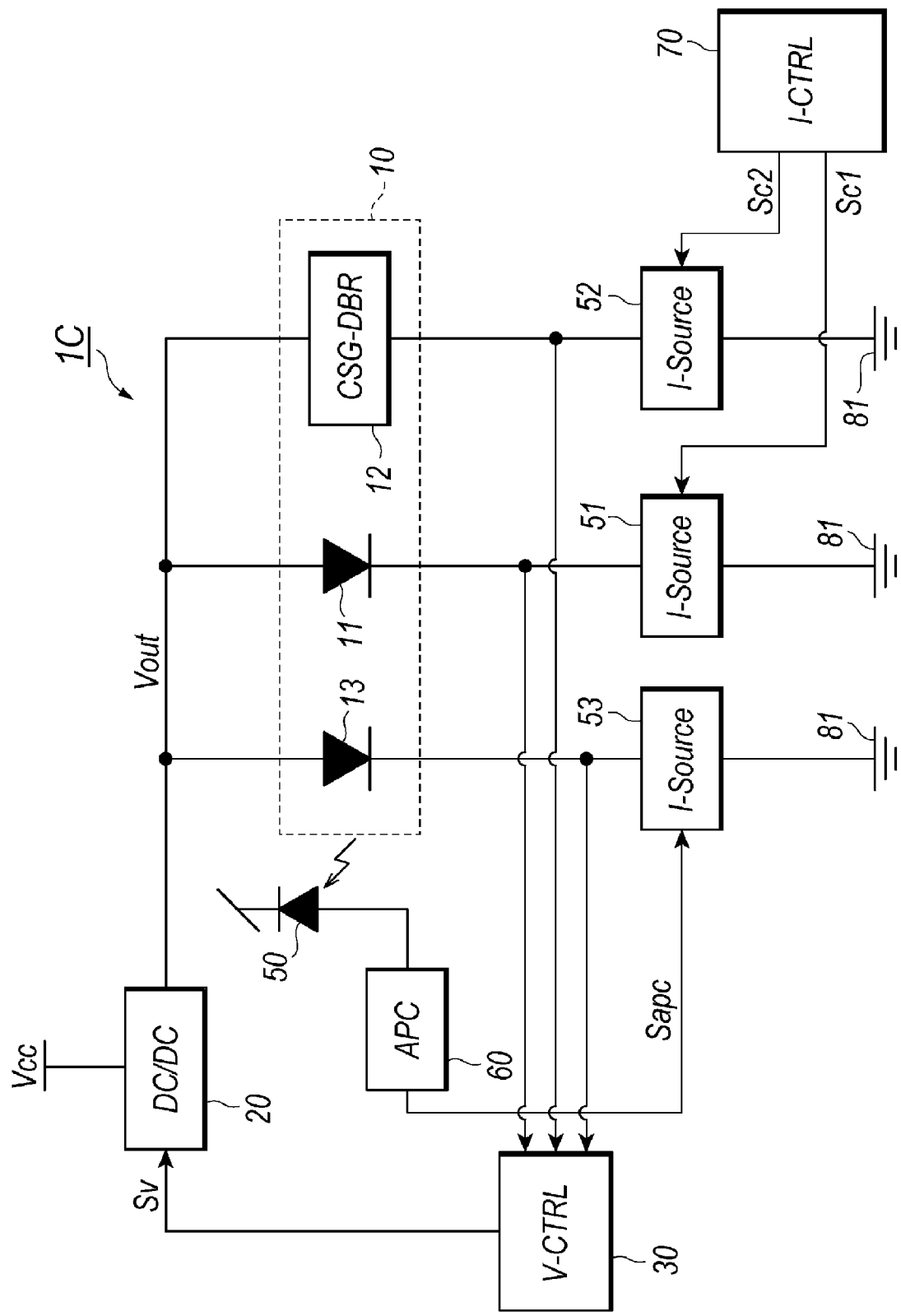
FIG. 4 is a block diagram of a driver circuit for the wavelength tunable LD, which is a circuit according to the third embodiment of the present invention.

FIG. 4 is a block diagram of a driver circuit for the tunable LD according to the third embodiment of the present invention. The driver circuit 1C has a connection between the tunable LD 10 and the current sources, 51 to 53, different from those of aforementioned embodiments shown in FIGS. 1 and 3.

That is, the first current source 51 of the present embodiment is set between the SG-DFB region 11 and the ground 81, and may adjust the current flowing therein by the control signal Sc1 provided from the current control 70. The second current source 52, which is set between the CSG-DBR region 52 and the ground 81, may adjust the current flowing therein by the control signal Sc2 also provided from the current control 70. The third current source 53, which is set between the SOA region 13 and the ground 71, may adjust the current by the signal Sapc provided from the APC circuit 60.

The voltage control 30 of the present embodiment may monitor the biases appeared in the current sources, 51 to 53, and may adjust the output Vout of the DC/DC converter 20 such that a minimum bias among the biases to the current sources, 51 to 53, becomes a value exceeding by the preset margin necessary to operate the current sources, 51 to 53, normally. Even when the driver circuit 1C like the present embodiment shown in FIG. 4 where the current sources are set between the tunable LD 10 and the ground, the voltage controller 30 may adjust the output Vout of the DC/DC converter 20 so as to be in the minimum voltage necessary to operate the current sources normally, which may reduce the power consumption of the driver circuit 1C.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

I claim:

1. A driver circuit for a wavelength tunable laser diode that includes an optically gain regions to generate light supplied with a first current from a first source through a first electrode, a wavelength selective region to set a wavelength of said light supplied with a second current from a second source through said second electrode, and an optical amplifying region to amplify said light supplied with a third current from a third source through a third electrode, said driver circuit comprising:
    a DC/DC converter configured to couple with at least two of said first to third sources; and
    a voltage controller for controlling an output of said DC/DC converter provided to said at least two of said first to third sources,
    wherein said voltage controller, by monitoring said outputs of said at least two of said first to third sources individually, sets said output of said DC/DC converter equal to a voltage greater than a largest output among said outputs by a preset margin to operate said sources normally.

2. The driver circuit of claim 1,
    wherein said first source and said second source are commonly supplied with said output of said DC/DC converter, and said third source are supplied with an output of another DC/DC converter.

3. The driver circuit of claim 1,
    wherein said third source is a current source controlled by an auto-power control circuit including a photodiode to monitor an optical output of said wavelength tunable laser diode.

4. The driver circuit of claim 3,
    wherein said current source includes a current mirror circuit providing a source transistor and a minor transistor whose control electrode is connected to a control electrode of said source transistor, and
    wherein said preset margin is a voltage difference between current electrodes of said minor transistor.

5. The driver circuit of claim 1,
    wherein said first source and said second source are current sources controlled by a current controller to set said wavelength of said wavelength tunable laser diode.

6. The driver circuit of claim 5,
    wherein each of said current sources includes a current minor circuit providing a source transistor and a mirror transistor whose control electrode is connected to a control electrode of said source transistor, and
    wherein said preset margin is a voltage difference between current electrodes of said minor transistor.

7. A driver circuit to drive a wavelength tunable laser diode comprising an SG-DFB region to generate light, a CSG-DBR region to determine a wavelength of said light, and an SOA region to amplify said light generated in said SG-DFB region and said wavelength thereof being determined said by said CSG-DFB region, comprising:
    a first current source configured to bias said SG-DFB region to generate said light;
    a second current source configured to bias said CSG-DBR region to provide current to a heater implemented within said CSG-DBR region;
    a third current source configured to bias said SOA region;
    a DC/DC converter to supply an output to said first to third current sources; and
    a voltage controller to control said output of said DC/DC converter by monitoring a bias level of said SG-DFB region by said first current source, a bias level of said CSG-DBR region by said second current source, and a bias level of said SOA region by said third current source,
    wherein said output of said DC/DC converter is set to be equal to a value greater than a bias level largest among said bias levels by a preset margin to operate said first to third current sources normally.

8. A driver circuit to drive a wavelength tunable LD including an SG-DFB region to generate light, a CSG-DBR region to determine a wavelength of said light, and an SOA region to amplify said light generated in said SG-DFB region and said wavelength thereof determined by said CSG-DBR region, comprising:
    a first current source configured to bias said SG-DFB region to provide a first current;
    a second current source configured to bias said CSG-DBR region to provide a second current;
    a third current source configured to bias said SOA region to provide a third current;
    a first DC/DC converter to supply a first output to said first current source and said second current source;

a second DC/DC converter to supply a second output to said third current source; and a voltage controller configured to monitor individually a first bias level of said SG-DFB region by said first current source, a second bias level of said CSG-DBR region by said second current source, and a third bias level of said SOA region by said third current source, wherein said voltage controller sets said first output of said first DC/DC converter to be equal to a value larger than a largest bias level among said first bias level and said second bias level by a preset margin necessary to operate said first and second current sources normally, and wherein said voltage controller sets said second output of said second DC/DC converter to be equal to a value larger than said third bias level by said present margin.

9. A method to control a wavelength tunable LD that includes a SG-DFB region to generate light by being provided with a current from a first current source, a CSG-DBR region to determine a wavelength of said light by being provided with a second current from a second current source, and an SOA region to amplify said light by being provided with a third current from a third current source, said method comprising steps of:

setting an output of a DC/DC converter commonly connected to said first to third current sources in a value enough higher than a value necessary to operate said current sources normally;

selecting said wavelength by adjusting said first current provided to said SG-DFB region and said second current provided to said CSG-DBR region;

setting a magnitude of said light by adjusting said third current provided to said SOA region;

determining a maximum bias voltage among bias voltages each provided to said SG-DFB region, said CSG-DBR region and said SOA region by said first to third current sources, respectively, by monitoring said bias voltages; and decreasing said output of said DC/DC converter in another voltage larger than said maximum voltage by a preset margin necessary to operate said current sources normally.

* * * * *